(12) United States Patent
Abe et al.

(10) Patent No.: US 8,134,433 B2
(45) Date of Patent: Mar. 13, 2012

(54) SUPERCONDUCTING MAGNET APPARATUS

(75) Inventors: Mitsushi Abe, Hitachinaka (JP); Takeshi Nakayama, Hitachinaka (JP); Masanori Takahashi, Mito (JP)

(73) Assignee: Hitachi, Ltd., Tokyo (JP)

( * ) Notice: Subject to any disclaimer, the term of this patent is extended or adjusted under 35 U.S.C. 154(b) by 785 days.

(21) Appl. No.: 10/950,392

(22) Filed: Sep. 28, 2004

(65) Prior Publication Data

US 2005/0068139 A1    Mar. 31, 2005

(30) Foreign Application Priority Data

Sep. 30, 2003    (JP) .................................. 2003-340210

(51) Int. Cl.
*H01F 6/00*    (2006.01)
(52) U.S. Cl. ........................................ 335/216; 324/319
(58) Field of Classification Search .................. 335/216, 335/299, 300; 324/318–320
See application file for complete search history.

(56) References Cited

U.S. PATENT DOCUMENTS

| | | | | |
|---|---|---|---|---|
| 5,485,088 A | * | 1/1996 | Westphal et al. | 324/320 |
| 5,982,260 A | * | 11/1999 | Byrne | 335/216 |
| 6,011,454 A | * | 1/2000 | Huang et al. | 335/216 |
| 6,570,475 B1 | | 5/2003 | Lvovsky et al. | |
| 6,580,346 B1 | | 6/2003 | Takeshima et al. | 335/216 |
| 6,600,318 B1 | | 7/2003 | Kakugawa et al. | |
| 6,707,359 B2 | | 3/2004 | Yoshida et al. | |
| 6,909,348 B2 | | 6/2005 | Kakugawa et al. | |

FOREIGN PATENT DOCUMENTS

| | | |
|---|---|---|
| EP | 0 807 940 | 11/1996 |
| EP | 10099296 | 4/1998 |
| JP | 6-132120 A | 5/1994 |
| JP | 09-153408 | 6/1997 |
| JP | 2002-17709 A | 1/2002 |
| JP | 2002-34947 A | 2/2002 |
| JP | 2002336215 A | 11/2002 |
| WO | 02/27346 | 4/2002 |
| WO | 02/49513 A1 | 6/2002 |
| WO | 02/065149 | 8/2002 |

* cited by examiner

*Primary Examiner* — Ramon Barrera

(74) *Attorney, Agent, or Firm* — Mattingly & Malur, PC

(57) ABSTRACT

Main coils, counteracting coils and correction coils, each forming superconducting coil, are enclosed in two cooling medium chamber facing to each other and an imaging region is formed between the two cooling medium chamber positioned in each vacuum chamber, the main coils being divided into two pieces to reduce the current density and the maximum experience magnetic filed and compression stress.

7 Claims, 4 Drawing Sheets

SUPERCONDUCTING MAGNET APPARATUS

CLAIM OF PRIORITY

The present application claims priority from Japanese application serial NO. 2003-340210, filed on Sep. 30, 2003, the content of which is hereby incorporated by reference into this application.

BACKGROUND OF THE INVENTION

The present invention relates to a superconducting magnet apparatus suitable for a magnetic filed generation source of a magnetic resonance imaging apparatus.

A superconducting magnet apparatus used as a magnetic field generation source of a magnetic resonance imaging, for example, comprises a pair of cooling medium chamber enclosing a plurality of superconducting coils having different diameter and formed annularly, a pair of vacuum chamber enclosing each cooling medium chamber, and a connecting bar connecting each of the vacuum chambers so as to form a magnetic field space (measuring space) between the pair of vacuum chamber. Such apparatus is disclosed in Japanese Laid-open Patent Publication Hei-9-153408 and U.S. Pat. No. 6,580,346B1 corresponding to Japanese Laid-open Patent Publication Hei-9-153408.

Each cooling medium chamber includes main coil, counteracting coil, correction. coil forming superconducting coils, respectively. The main coils is composed by a supercondunting coil and generates high intensity magnetic field in the central region of the magnetic field space and generates uniform magnetic field higher than a predetermined level. The counteracting coil prevents the magnetic field generated by the main coil from leaking outside the vacuum chamber. The correction coil flows the current in same direction or reverse direction to that of the main coil and corrects the magnetic field by the main coil. In the MRI apparatus such as above described apparatus, it is required to form a high intensity static magnetic field in the imaging region so as to obtain diagnosis results together with a lot of information and clear image.

SUMMARY OF THE INVENTION

In the prior art, to increase the magnetic field in the imaging region, the current per one block of main coil structured by the single coil is increased to strengthen magnetomotive force. Therefore, the experience magnetic filed and compression stress of the main coils increase according to the increasing of the current density. When experience magnetic field become large, maximum allowable current reduces and it is impossible to keep superconductiong condition stable.

As a result, it is obliged to use expensive wiring material, and therefore, the cost-up occurs. When the compression stress is increased according to the magnetomotive force increase, the thickness of the support have to be thicker. The magnetic field space becomes narrow and feeling of oppression is given to the patient.

Shortly, it is preferable to bring the main coils close each other in the cooling medium chamber to improve the uniformity of the magnetic field of the imaging region. However, the narrow magnetic space gives the feeling of oppression to the patient. Therefore, It is desirable to make the magnetic space large as much as possible. An object of the present invention is to increase the magnetic field in the magnetic field space at a condition of low current density of the superconducting coils.

According to the present invention, the magnetic field in the magnetic field space at a condition of low current density of the superconducting coils is increased and maximum experience magnetic field and compression stress of the superconducting coils are reduced.

DETAILED EXPLANATION OF PREFERRED EMBODIMENTS

Figure 1:
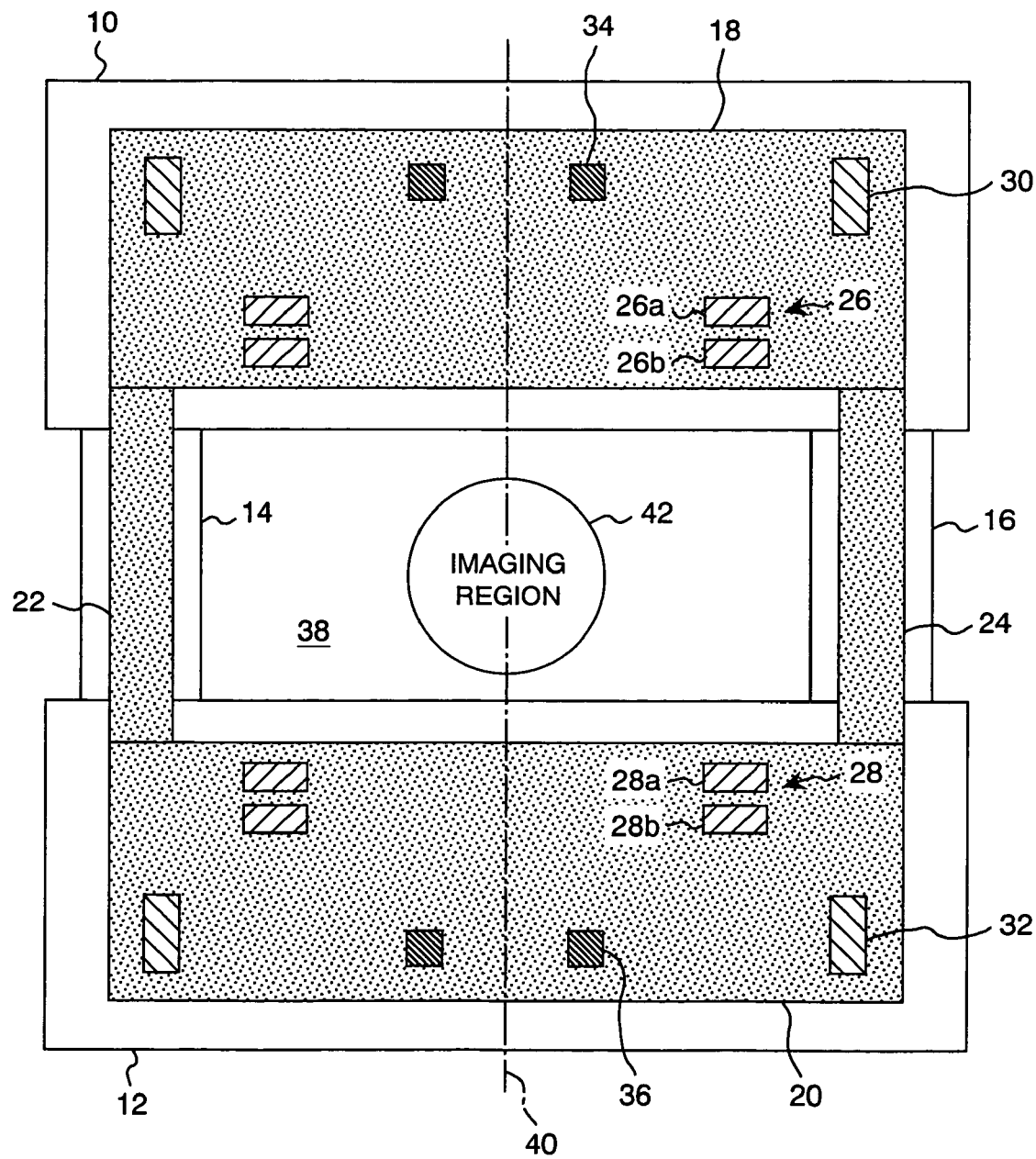
FIG. 1 is a cross sectional view of the superconducting magnet apparatus showing an embodiment of the present invention.

Hereinafter, an embodiment according to the present invention will be explained with reference to the drawings FIG. 1 is a cross sectional view of the superconducting magnet apparatus showing an embodiment of the present invention. A superconducting magnet apparatus of vertical magnetic field type has a pair of vacuum chambers 10 and 12 and is used as a magnetic field generation source for the magnetic resonance imaging apparatus.

The vacuum chambers are formed cylindrically and positioned separately at upper and lower portions. The upper vacuum chamber 10 and lower vacuum chamber 12 are connected each other through supports 14 and 16. A cylindrical cooling medium chambers 18 and 20 are accommodated in the vacuum chamber 10 and 12, and pipes 22 and 24 forming cooling paths are inserted into the supports 14 and 16. The cooling medium chambers 18 and 20 opposing each other are accommodated in the vacuum chambers 10 and 12 so as to suppress heat convection.

The magnet field space (measuring space) is formed between the vacuum chambers 10 and 12. Main coils 26, 28, counteracting coil 30, 32, correction coils 34, 36 are enclosed together with superconducting cooling medium (not shown) in the cooling medium chambers 18 and 20. These coils have different diameter and act as supercondunting coils. As each superconducting coil material, for example, wiring material made of NbTi is used, and as superconducting cooling medium, for example, liquid helium is used. The cooling medium is cooled, for example, by a refrigerator (not shown).

The main coils 26, 28 counteracting coils 30, 32 and correction coils 34, 36 are annularly formed and arranged concentric with respect to the center of an axis 40. The main coil 26 and 28 form a spherical imaging region 42 in the partial region of the magnetic field space 38. The imaging region 42 is an uniform magnetic field. The main coils 26 and 28 form highest intensity magnetic field in the plurality of superoducting coils and uniform and vertical magnetic field (static magnetic field) more than predetermined level in the magnetic field region 38.

On the other hand, the counteracting coils 30 and 32 are arranged in adjacent to the main coils 26 and 28 with largest diameter in the plurality of superconducting coils. The direction of the current flowing through the counteracting coils 30 and 32 is opposed to that of the main coils 26 and 28. By flowing the current reverse to the main coils 26 and 28 through the counteracting coils 30 and 32, magnetic field generated by the main coils 26 and 28 is cancelled or counteracted and it is able to prevent magnetic field from leaking to the outside.

The correction coils 34 and 36 are arranged adjacent to the counteracting coils 30 and 32. The correction coils 34 and 36 correct un-uniform component of the magnetic field in the imaging region 42 in the magnetic field formed by the main coils 26, 28 and counteracting coils 30, 32, and keep the imaging region 42 uniform magnetic field region. The magnetomotive force of the correction coils 30 and 32 are lower than that of the main coils 26,28 and counteracting coils 30 32. The direction of the current of the correction coils 34 and 36 are determined by the un-uniform component of the magnetic field generated at the imaging region 42. A plurality of coils having different diameter are applicable as the correction coils 34 and 36. In the case, the current direction may be changeable to select the same direction as the main coils or reverse direction according to the un-uniform component of the imaging region 42.

The main coils 26 and 28, counteracting coils 30, 32 and correction coils are supported by a support member (not shown) respectively, and the support member is fixed to the cooling chambers 18, 20.

Figure 2:
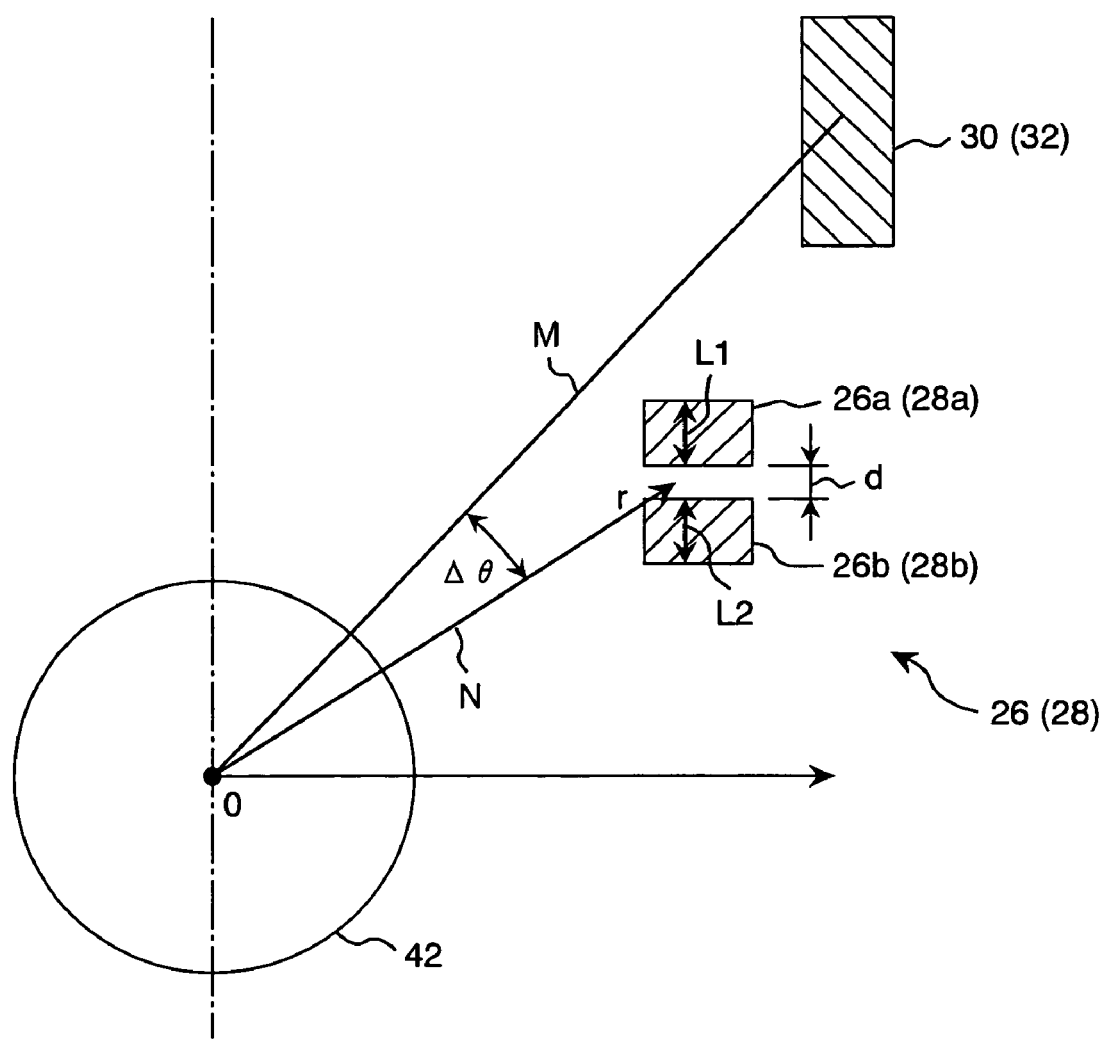
FIG. 2 is a view explaining the relationship between the divided main coils and counteracting coils.

In the embodiment, to reduce the current density of the main coils 26, 28 in the superconducting coils, each main coils 26, 28 is divided into two main coils 26a, 26b and 28a, 28b respectively as shown in FIG. 2. The distance d between the divided main coil 26a and 26b and the distance d between the main coil 28a and 28b are determined by the following formula (1).

$$\tfrac{1}{5}(L1+L2) \leq d \leq \tfrac{1}{2} d\theta \cdot r \qquad (1)$$

where L1 is length of the main coils in the sectional plane (short side length of rectangular), L2 is length of the main coils 26a, 26b in the sectional plane (short side length of rectangular), r is distance between the center O of imaging region 42 and the center of the main coils 26, 28 (distance in the apace between the center of the main coils 26a, 28b and that of the main coils 26b, 28b), θ is an angle which a strait line M connecting the center O of the imaging region 42 and center of counteracting coil 30 or 32, and a strait line N connecting the center O and center of the main coil 26 and 28 make.

Figure 3:
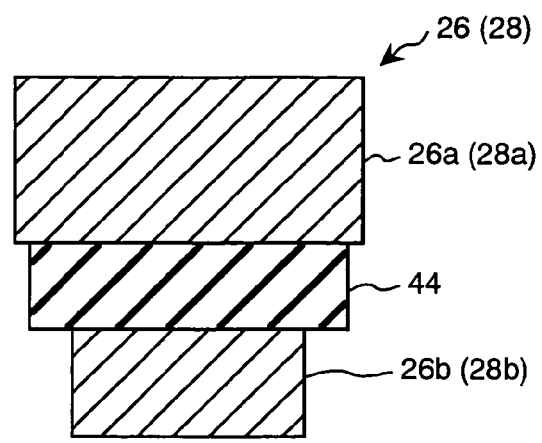
FIG. 3 is a cross sectional view when a support member is inserted between the divided main coils.

In this case, a support member 44 using insulating material is inserted between the divided main coils 26a, 26b and the main coils 26b, 28b as shown in FIG. 3 and each main coils 26a, 26b, 28a, 28b is supported by the cooling chamber 18 and 20 through the support member 44 or the support.

As described above, in the embodiment, the main coils 26, 28 in the plurality of superconducting coils are separated into two portions. Therefore, it is capable of reducing the current density in comparison with a single unit coil. As a result, the maximum experience magnetic field of the main coils 26a, 26b, 28a, 28b may be reduced. Further, the compression stress of the main coils 26, 28 may be reduced by dispersing the electromagnetic force generated by each main coils 26a, 26b, 28a, 28b.

The reduction of the maximum experience magnetic field of the main coils 26a, 26b, 28a, 28b results in increase of maximum allowable current of the main coils 26a, 26b, 28a, 28b in comparison with the main coils 26, 28 structured by a single unit coil. Therefore, it is capable of using cheaper wire as material of main coils 26a, 26b, 28a, 28b and reducing the cost in generating same magnetomotive force.

By dispersing the magnetomotive force from each main coils 26a, 26b, 28a, 28b, the compression stress may be reduced. Accordingly, it is able to use thinner support using in comparison with the main coils 26, 28 of single unit coil, and the cost down is carried out by reducing the support material. On the other hand, if the same thick support is used, the support intensity is improved.

As described above, it is capable of thinning the support thickness by dividing the main coils 26, 28, as a result, the main coils 26a and 28a may be brought close each other and uniformity of magnetic field of the imaging region 42 is considerably improved.

Figure 4:
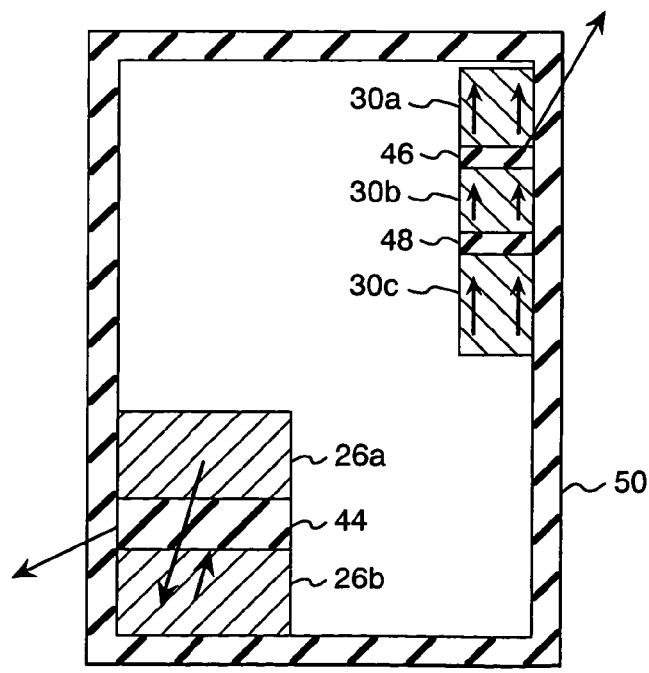
FIG. 4 is a cross sectional view when the main coils and the counteracting coils are divided into plural pieces.

In dividing the plurality of the superconducting coils into a plurality of groups or sections, the main coils 26 and 28 are divided into two pieces, and the counteracting coils 30 and 32 may be divided into three pieces as shown in FIG. 4. A support member 46 is inserted between the divided counteracting coils 30a and 30b, and a support member 48 is inserted between the divided counteracting coils 30b and 30c in the counteracting coils 30a, 30b, 30c or 32a, 32b, 32c. The support member 46 and 48 are united with a support 50 formed of box type same as support member 44 inserted between the main coils 26a and 26b, or between the main coils 28a and 28b. That is, the divided counteracting coils 30a, 30b, 30c or 32a, 32b, 32c are supported by the support member 46 and 48 or the support 50.

In this case, the counteracting coils 30, 32 are divided into three pieces and the electromagnetic force by each counteracting coils 30a, 30b, 30c or 32a, 32b, 32c is dispersed. Therefore, it is able to reduce the compression stress and the thickness of the support 50 in comparison with the single united coil.

In the embodiment, the main coils 26, 28, counteracting coils 30, 32 are divided into plural pieces. It is possible to divide the correction coils 34, 36 into plural pieces and insert support members between the divided correction coil. The divided correction coils are supported by the support member or support. In this case, it is possible to thin the thickness of the support and use cheaper wiring material according to the reduction of the maximum experience magnetic field.

When the main coils 26 and 28 are divided into two pieces, it is possible to insert a ferromagnetic substance, for example, iron member inside the main coils 26b, 28b of the imaging region 42.

Figure 5:
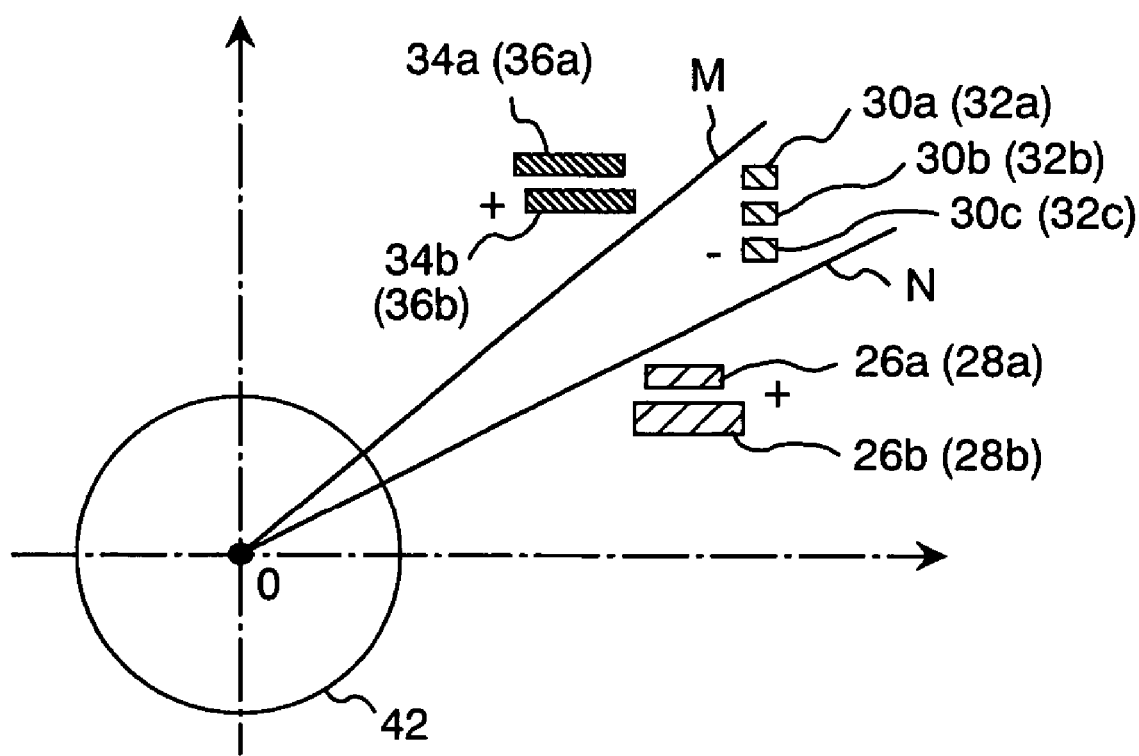
FIG. 5 is a view explaining position relationship when the main coils, counteracting coils and correction coils are divided into plural pieces.

In dividing the main coils 26, 28, counteracting coils 30, 32 and correction coils 34, 36 into plural pieces, for example, counteracting coils 30a, 32b, 30b, 32b, 30c and 32c are arranged in the region between the strait lines M and N as shown in FIG. 5 The main coils 26a, 28a, 26b, and 28b are arranged in the lower region and the correction coils 34a, 36b, 34b and 36b are arranged in the upper region outside the region surrounded by the strait lines M and N, respectively. When the current direction of the main coils 26 and 28 is set as positive, the current direction of the counteracting coils 30 and 32 is set as negative, and the current direction of the correction coils 34 and 36 is set as positive.

In constituting a MRI apparatus using a superconducting magnet apparatus according to the embodiment, it is required to install a transportation system for transporting a bed on which a patient to be inspected is put to the magnetic field space 38, and MRI signals from the patient are analyzed.

What is claimed is:

1. A superconducting magnet apparatus comprising:
 a pair of cooling medium chambers each enclosing a plurality of annular superconducting coils together with cooling medium;

a pair of vacuum chambers each enclosing each of said cooling medium chambers; and at least one connecting member for connecting said vacuum chambers connected such that the vacuum chambers are opposed to each other to form a magnetic field space therebetween having an imaging region intersecting the central axis of the magnetic field, wherein the plurality of superconducting coils includes a superconducting main coil in each of said cooling medium chambers, each of the main coils are respectively divided into a plurality of pieces along the central axial direction of the coils and each of the pieces of each of the main coils has the same direction of current flow, and wherein the divided pieces of each of the main coils are respectively supported by a single supporting member inserted between the divided pieces and each of the divided pieces is supported in contact with a face of the single supporting member.

2. The superconducting magnet apparatus according to claim 1, wherein said plurality of superconducting coils enclosed in each of said cooling medium chambers includes, counteracting coils and correction coils.

3. The superconducting magnet apparatus according to claim 2, wherein each of said counteracting coils is respectively divided into a plurality of pieces along the central axis direction of the coils.

4. The superconducting magnet apparatus according to claim 2, wherein each of said correction coils is respectively divided into a plurality of pieces along the central axis direction of the coils.

5. The superconducting magnet apparatus according to claim 2, wherein each of said counteracting coils and each of said correction coils is respectively divided in the central axis direction into plural pieces.

6. The superconducting magnet according to claim 1,
wherein said plurality of superconducting coils enclosed in each of said cooling medium chambers further includes superconducting counteracting coils, and
wherein the direction of current flow through said superconducting main coils is opposite to that of a direction of current flowing through the superconducting counteracting coils.

7. The superconducting magnet according to claim 1, wherein the divided pieces of each of the superconducting main coils are integrally supported by the supporting member.

* * * * *